(12) United States Patent
Williams

(10) Patent No.: US 6,793,732 B1
(45) Date of Patent: Sep. 21, 2004

(54) METHOD AND KIT FOR GROWING CROSS-SHAPED CRYSTALS

(75) Inventor: Stacy Williams, Watkinsville, GA (US)

(73) Assignee: Dr. DaBrain Science Toys, Inc., Watkinsville, GA (US)

(*) Notice: Subject to any disclaimer, the term of this patent is extended or adjusted under 35 U.S.C. 154(b) by 52 days.

(21) Appl. No.: 10/060,928

(22) Filed: Jan. 29, 2002

Related U.S. Application Data

(60) Provisional application No. 60/266,348, filed on Feb. 2, 2001.

(51) Int. Cl.[7] ............................................. C30B 25/04
(52) U.S. Cl. ........................................ 117/68; 117/937
(58) Field of Search ................................... 117/68, 937

(56) References Cited

U.S. PATENT DOCUMENTS 5,567,451 A * 10/1996 Rinn et al. .................... 426/13

6,576,277 B2 * 6/2003 Livisay et al. ................ 426/74

* cited by examiner

Primary Examiner—Felisa Hiteshew
(74) Attorney, Agent, or Firm—Smith, Gambrell & Russell, LLP

(57) ABSTRACT

The present invention provides a method for growing crystals in a gel matrix by reacting tartrate anions with cations, the cations selected from the group consisting of $K^+$, $Ca^{2+}$, $Na^+$, $Mg^{2+}$ and $Li^+$. A method particularly adapted for crowing cross-shaped crystals includes forming a gel matrix through cooling of a mixture of potassium bitartrate, boiling water and gelatin to less than 65° F. until the matrix solidifies, adding calcium chloride to the gel matrix to react the calcium chloride with the potassium bitartrate at a temperature of preferably less than 65° F. until crystals form, and separating cross-shaped crystals that have reached a desired size from the gel matrix by warming the gel to a liquid state and removing the crystals.

19 Claims, 1 Drawing Sheet

$M^+$ can be $K^+$, $Ca^{2+}$, $Na^+$, $Li^+$, $Mg^{2+}$

METHOD AND KIT FOR GROWING CROSS-SHAPED CRYSTALS

CROSS-REFERENCE TO RELATED APPLICATION

The present application claims priority to provisional application Ser. No. 60/266,348, filed Feb. 2, 2001, which is relied on and incorporated herein by reference.

BACKGROUND OF THE INVENTION

Crystal growth in gels is well-known in the art. Gels slow down the crystal growing process so that crystals can be grown larger and in desired formations. However, among the wide array of techniques known for growing a variety of crystal formations in gels, no easy, child-safe method has been shown for growing cruciform, or cross-shaped, crystals.

Accordingly, the present invention provides a method and kit for growing cross-shaped crystals through the combination of safe chemicals found in common foods. The present invention thus provides aesthetic, educational and economic benefits over the prior art, as no expensive special laboratory equipment or chemicals are needed to grow desirable cross-shaped crystals.

SUMMARY OF THE INVENTION

The present invention provides a method for growing cross-shaped crystals. Gelatin and cream of tartar are mixed together with boiling water. A clear gel forms after the mixture is cooled for 12 to 18 hours. Subsequently, calcium chloride solution is poured on top of the gel. The solution soaks down into the gel forming cross-shaped crystals (other complexes can form in addition to the crystals). Preferably, the cross-shaped crystals are permitted to grow for at least two weeks and below a temperature of about 60° F. until a desirable size of cross-shaped crystals is produced.

In an embodiment of the present invention, the cross-shaped crystals product is isolated from the gel. The crystals may be displayed in a clear viewing apparatus. An exemplary apparatus includes a glass or plastic key chain.

The present invention also provides a kit for producing cross-shaped crystals. In an embodiment of the present invention, the kit includes cream of tartar, gelatin, calcium chloride solution, and a crystal growing chamber. The kit further includes instructions for using the contents of the kit in the method of the present invention to grow cross-shaped crystals.

In an embodiment of the present invention, a kit for growing cross-shaped crystals also includes a magnifying glass for examining the crystals.

In a further embodiment of the present invention, a kit for growing cross-shaped crystals also includes a clear sealable key chain container, such as a plastic or glass cylinder with a securable top, for displaying the crystals.

DETAILED DESCRIPTION OF THE INVENTION

Figure 1:
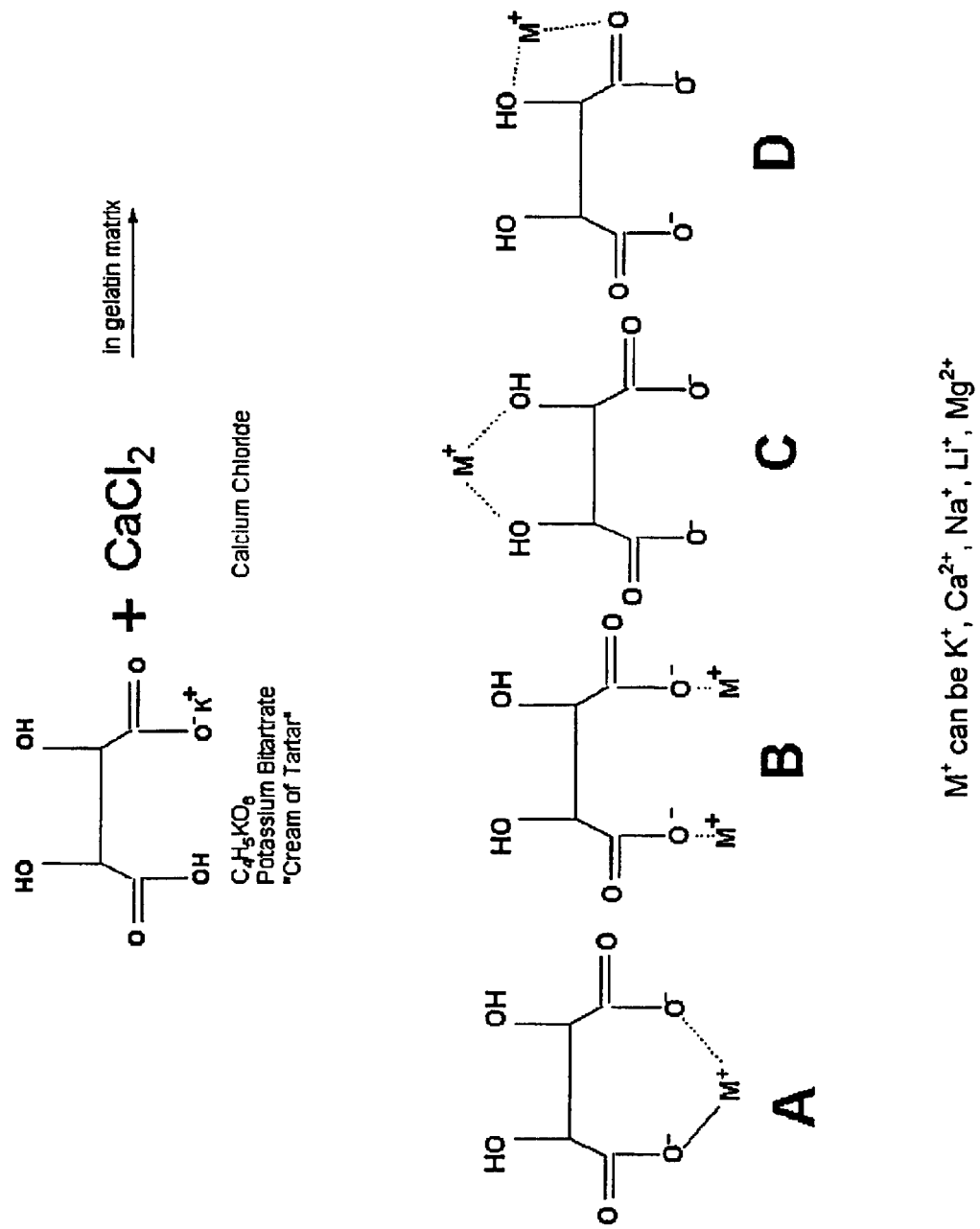
FIG. 1 depicts an exemplary reaction of the present invention resulting in cross-shaped crystals, including the structural depictions of the reactants and probable products.

The present invention provides a crystal growing method and kit for producing cross-shaped crystals. Because the reactants of the present invention are found in ordinary foods and safe when used properly, the invention is particularly well-adapted for use by persons of all ages for both entertainment and educational purposes.

In embodiments of the present invention, the cross-shaped crystals can be separated from a gel matrix, and displayed for their aesthetic value.

Those of ordinary skill in the art will further appreciate that the amounts of reactants and products in the present invention will vary depending on the desired results. Accordingly, the amounts set forth in this description are exemplary for illustrating the invention in an embodiment of the disclosed method and kit.

Referring to FIG. 1, the preferred embodiment of the present invention includes reacting potassium bitartrate (cream of tartar) with calcium chloride in a gelatin matrix to produce cross-shaped crystals. In alternative embodiments of the invention, however, any presentation of a compound that can be ionized, i.e., disassociated into cation and anion, into tartrate anions may be substituted in place of potassium bitartrate. For example, alternative tartrate-containing compounds include tartaric acid, dipotassium tartrate, or any variation of the tartrate anion.

Further, in alternative embodiments of the present invention, other compounds ionizable into cations of $K^+$, $Ca^{2+}$, $Na^+$, $Mg^{2+}$ or $Li^+$ may be substituted for calcium chloride. In these alternative embodiments exemplary counter balancing anions to the $K^+$, $Ca^{2+}$, $Na^+$, $Mg^{2+}$ or $Li^+$ cations may include sulfate, bromide, iodide, acetate, nitrate, nitrite, and the like.

The likely products of the reaction include an amalgam of structures (A–D) shown in FIG. 1. In products A–D, $M^+$ can be $K^+$, $Ca^{2+}$, $Na^+$, $Mg^{2+}$ or $Li^+$. The major components are tartrate dianion, calcium dication, and potassium cation. There may be other cations, e.g. sodium and lithium, present in gelatin that affect crystal growth. Cross-shaped crystal is a combination of all cations and anions in the invention.

In an embodiment of the present invention, a gelatin matrix is formed to grow the crystals. Approximately 7.0 grams of gelatin, such as produced by Knox Gelatin (TN, USA), Bloom # 225+/−10, is added to 0.25 cups of room temperature water in a clean container. Approximately 2.5 grams of cream of tartar (Potassium Hydrogen Tartrate), such as CAS#: 868-14-4 produced by Acros Organics (NJ, USA), is combined with the gelatin and room temperature water. The mixture of gelatin and cream of tartar is permitted to stand for about 1 minute. The mixture should become stiff.

Approximately 0.75 cups of boiling water is subsequently added to the gelatin and cream of tartar mixture. The solution of boiling water and gelatin and cream of tartar mixture is stirred until the mixture dissolves.

The gelatin solution is allowed to stand uncovered in the container for over 10 hours, and preferably between 12–18 hours, to form the gelatin matrix. For best set up of the gel, the temperature should be kept to less than 65° F., and preferably $\leq 60°$ F., and kept out of direct sunlight.

While the gel sets up, approximately 3.0 grams of calcium chloride ($CaCl_2$), such as CAS#: 10043-52-4 produced by J. T. Baker (N.J., USA), is added to 0.25 cups of room temperature water in a separate clean container. Preferably, the calcium chloride is in a solution of 51.0 mL of municipally sourced bottled water and 8.0 mL of hydrogen peroxide ($H_2O_2$ 3%) when added to the room temperature water. The hydrogen peroxide prevents mold during gel growth.

After the gel matrix sets up, the calcium chloride solution is poured into the matrix. Preferably, the calcium chloride solution is poured along the inside of the container wall of the gel matrix, avoiding splashing directly on the top of the gel matrix.

White crystals will be visible at the top of the gel within several hours, the crystal product will continue to grow to larger cross-shaped crystals of approximately 1/8" in diameter over several weeks.

In an embodiment of the present invention, the cross-shaped crystals are grown for at least two weeks in the gel matrix at a temperature of less than 65° F., and preferably ≦60° F. The crystals may be grown in the matrix in a conventional refrigerator; however, care should be taken to prevent freezing of the matrix.

In embodiments of the present invention, the cross-shaped crystals may be extracted from the gel. To extract the crystals, the gel is permitted to become very warm. In exemplary embodiments, the matrix is exposed to the sun until the gel dissolves or may be heated in a microwave oven until gel dissolves (approximately 1–3 minutes). The gel turns to a liquid state, and the white, cross-shaped crystals should fall to the bottom. The liquid is discarded while retaining the crystals. Preferably, the container and retained crystals are washed with water and the water discarded.

The crystals may be gently scraped from the container, such as with a dull knife. Preferably the crystals are dried, such as on a paper towel.

In an embodiment of the present invention, desirable cross-shaped crystals may be selected for display in a viewing a container. A plastic or glass sealable key chain provides an exemplary container for displaying crystals.

In an embodiment of the present invention, a crystal growing kit for commercial distribution is provided. The kit preferably includes pre-measured packages of gelatin, cream of tartar, and calcium chloride which are used as described in the aforementioned method.

The kit of the present invention may optionally include a crystal growing chamber, such as a clean, conventional jar. A gel matrix is formed in the crystal growing chamber and the calcium chloride reacted with potassium bitartrate in the matrix.

The kit of the present invention may optionally include a magnifying glass.

The kit of the present invention may optionally include a key chain for displaying desirable crystals produced by the method of the present invention. The key chain is preferably clear and can be opened and sealed to contain the crystals. A twist or pop lid provides an exemplary sealing apparatus. The key chain preferably comprises plastic or glass.

The kit of the present invention preferably includes instructions for reacting cream of tartar with calcium chloride in a gel matrix to produce crystals. Preferably, the crystals are cross-shaped and about 1/8" in diameter.

Accordingly, while the invention has been described with reference to the structure disclosed, it is not confined to the details set forth, but is intended to cover such modifications or changes may fall within the scope of the following claims.

What is claimed is:

1. A method for growing crystals comprising reacting potassium bitartrate with calcium chloride in a gel matrix.

2. The method of claim 1 wherein a cross-shaped crystal product is produced.

3. The method of claim 2 wherein said gel matrix is formed by combining potassium bitartrate with boiling water and gelatin, and cooling at a temperature of less than 65° F. for more than 10 hours.

4. The method of claim 3 wherein the gel matrix is formed by cooling at a temperature ≦60° F. for between 12 to 18 hours.

5. The method of claim 3 wherein calcium chloride is reacted with potassium bitartrate for at least fourteen days.

6. The method of claim 5 wherein the calcium chloride is reacted with potassium bitartrate at a temperature less than 65° F.

7. The method of claim 6 wherein the calcium chloride is reacted with potassium bitartrate at a temperature ≦60° F.

8. The method of claim 6 wherein the crystals are separated from the gel matrix and enclosed in a viewing container.

9. The method of claim 6 wherein the calcium chloride is in a solution of water and hydrogen peroxide.

10. The method of claim 2 wherein calcium chloride is reacted with potassium bitartrate for at least fourteen days.

11. The method of claim 10 wherein the calcium chloride is reacted with potassium bitartrate at a temperature less than 65° F.

12. The method of claim 11 wherein the calcium chloride is reacted with potassium bitartrate at a temperature ≦80° F.

13. The method of claim 2 wherein the crystals are separated from the gel matrix.

14. The method of claim 13 wherein the crystals separated from the gel matrix are enclosed in a viewing container.

15. The method of claim 2 wherein the calcium chloride is in a solution of water and hydrogen peroxide.

16. The method of claim 1 wherein the calcium chloride is in a solution of water and hydrogen peroxide.

17. A method of growing crystals comprising complexing tartrate anions with cations wherein said cations include at least one cation selected from the group consisting of $K^+$, $Ca^{2+}$, $Na^+$, $Mg^{2+}$ and $Li^+$.

18. The method of claim 17 further comprising the step of ionizing a compound prior to complexing the tartrate anions with the cations wherein said compound includes the at least one cation counterbalanced by an anion selected from the group consisting of chloride, sulfate, bromide, iodide, acetate, nitrate, and nitrite.

19. The method of claim 18 further comprising ionizing a second compound prior to complexing the tartrate anions with the cations wherein said second compound is selected from the group consisting of tartaric acid, potassium bitartrate, and dipotassium tartrate.

* * * * *

UNITED STATES PATENT AND TRADEMARK OFFICE
CERTIFICATE OF CORRECTION

PATENT NO.   : 6,793,732 B1
DATED        : September 21, 2004
INVENTOR(S)  : Williams, Stacy It is certified that error appears in the above-identified patent and that said Letters Patent is hereby corrected as shown below:

Column 4,
Line 42, should read as follows:
-- 17. A method for growing crystals in a gel matrix to produce cross-shaped crystals comprising complexing --

Signed and Sealed this

Fifth Day of April, 2005

JON W. DUDAS
*Director of the United States Patent and Trademark Office*